(12) United States Patent
Fang et al.

(10) Patent No.: US 10,964,768 B1
(45) Date of Patent: Mar. 30, 2021

(54) DISPLAY PANEL

(71) Applicant: Shenzhen China Star Optoelectronics Semiconductor Display Technology Co., Ltd., Shenzhen (CN)

(72) Inventors: Chunhsiung Fang, Shenzhen (CN); Yuanchun Wu, Shenzhen (CN); Poyen Lu, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 369 days.

(21) Appl. No.: 16/099,175

(22) PCT Filed: Sep. 19, 2018

(86) PCT No.: PCT/CN2018/106579
§ 371 (c)(1),
(2) Date: Nov. 5, 2018

(87) PCT Pub. No.: WO2019/237551
PCT Pub. Date: Dec. 19, 2019

(30) Foreign Application Priority Data

Jun. 11, 2018 (CN) .......................... 201810596337.1

(51) Int. Cl.
*H01L 27/32* (2006.01)
*H01L 51/52* (2006.01)

(52) U.S. Cl.
CPC ...... *H01L 27/3276* (2013.01); *H01L 51/5212* (2013.01); *H01L 2251/308* (2013.01)

(58) Field of Classification Search
None
See application file for complete search history.

(56) References Cited

U.S. PATENT DOCUMENTS

2016/0148985 A1* 5/2016 Park .................... H01L 27/3262
257/40
2019/0377445 A1* 12/2019 Jeong ....................... G06F 1/26

FOREIGN PATENT DOCUMENTS

CN 101359669 A 2/2009
CN 101393364 A 3/2009
(Continued)

OTHER PUBLICATIONS

Machine Translation of WO 2019/127716 (Year: 2019).*

*Primary Examiner* — J. E. Schoenholtz
(74) *Attorney, Agent, or Firm* — Leong C. Lei

(57) ABSTRACT

The present disclosure relates to a display panel including at least one scan line formed by a first metal layer, at least one data line formed by a second metal layer, and at least one dielectric layer between the first metal layer and the second metal layer. The scan line is of a segment structure including a plurality of sub-scan lines electrically connecting to connection patterns of the corresponding second metal layer via corresponding via holes of the dielectric layer, the connection patterns of the second metal layer electrically connects the sub-scan lines. The data line is of the segment structure including a plurality of sub-data lines electrically connecting to the connection patterns of the corresponding first metal layer via the corresponding via holes of the dielectric layer, and the connection patterns of the first metal layer electrically connects the sub-data lines.

10 Claims, 3 Drawing Sheets

(56) References Cited

FOREIGN PATENT DOCUMENTS

| | | | |
|---|---|---|---|
| CN | 106292036 A | 1/2017 | |
| CN | 107393873 A | 11/2017 | |
| CN | 108091679 A | 5/2018 | |
| KR | 20090131903 A | 12/2009 | |
| WO | WO-2019127716 A1 * | 7/2019 | ......... H01L 51/5237 |

* cited by examiner

DISPLAY PANEL

FIELD OF THE INVENTION

The present disclosure relates to a display field, and more particularly to a display panel.

BACKGROUND OF THE INVENTION

Flat display panels are widely used in computers, televisions, monitors, portable electronic devices, etc. As the market demands for large-size screens in portable electronic devices continue to increase, large-size displays using flat display panels have been fully developed and commercialized.

With the development of more advanced manufacturing equipment and materials engineering technology, the application of bendable, foldable and curved display in electronic products has become more and more abundant, which has brought great profit opportunities for electronic product manufacturers.

Flexible display is a highly competitive display technology in the future. By mounting flexible-display-medium electronic components and materials on a flexible or flexible substrate, the display is characterized by being able to bend or curl into any shape, which is light and thin. It is easy to carry, especially its foldability, so that the panel can obtain a larger display area without occupying more space.

In the conventional panel design, the scan line in the effective display area (AA) uses a metal material linear trace to span the entire effective display area, and a general low temperature polycrystalline thin film transistor (LTPS TFT) array substrate is adopted. Molybdenum metal is used as a scan line material, but molybdenum metal is a high-temperature brittle material, and the ductility is poor. When the radius of curvature of the panel is small, the fracture is likely to occur. Referring to FIG. 1, it is a schematic diagram of a folding manner of a conventional display panel. When the folding panel is folded along the bending line A/B, the general panel design level scan line will penetrate the AA area. When the bending radius of curvature is reduced, the metal line of the scan line is prone to crack. FIG. 2 is a schematic cross-sectional view of a conventional display panel. The panel mainly includes a substrate 1 disposed in order from bottom to top, a buffer layer 2, a gate insulating (GI) layer 3, and a scan line 4 formed of molybdenum metal, an interlayer insulating (ILD) layer 6, a data line 7 and the like, wherein the scan line 4 generates cracks 5 due to panel bending.

SUMMARY OF THE INVENTION

The present disclosure relates to a display panel for reducing the scan line break when the display panel is bent.

In one aspect, a display panel includes: at least one scan line formed by a first metal layer, at least one data line formed by a second metal layer, and at least one dielectric layer between the first metal layer and the second metal layer; the scan line being of a segment structure comprising a plurality of sub-scan lines electrically connecting to connection patterns of the corresponding second metal layer via corresponding via holes of the dielectric layer, and the connection patterns of the second metal layer electrically connecting the sub-scan lines together; and intersections between the data line and the connection patterns of the second metal layer being configured to be the segment structure, the data line being of the segment structure comprising a plurality of sub-data lines electrically connecting to the connection patterns of the corresponding first metal layer via the corresponding via holes of the dielectric layer, and the connection patterns of the first metal layer electrically connecting the sub-data lines together.

Wherein the dielectric layer is an inter-layer insulating layer.

Wherein the second metal layer is of a Ti/Al/Ti three-layer structure, a Mo/Al/Mo three-layer structure or a Mo/Cu double-layer structure.

Wherein the first metal layer includes molybdenum metal.

Wherein the scan line is located in a bend region of the display panel or throughout an entire active display area.

In another aspect, a display panel includes: at least one scan line formed by a first metal layer, at least one data line formed by a second metal layer, a conductive material layer for forming a conductive structure in the display panel, and at least one dielectric layer between the first metal layer and the conductive structure; and the scan line is of a segment structure comprising a plurality of sub-scan lines electrically connecting to connection patterns of the corresponding conductive material layer via corresponding via holes of the dielectric layer, and the connection patterns of the conductive material layer electrically connecting the sub-scan lines together.

Wherein the conductive material layer includes an organic light-emitting diode (OLED) anode material layer for forming an OLED anode.

Wherein the first metal layer includes molybdenum metal, and the OLED anode material layer is of an ITO/Ag/ITO three-layer structure.

Wherein the dielectric layer includes an organic planarization layer and an interlayer insulating layer.

Wherein the scan line is located in a bend region of the display panel or throughout an entire active display area.

In view of the above, the scan lines of the display panel adopts a segmented structure, and then connects the sub-scan lines together, thereby reducing the probability of occurrence of scan line break when the display panel is bent.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
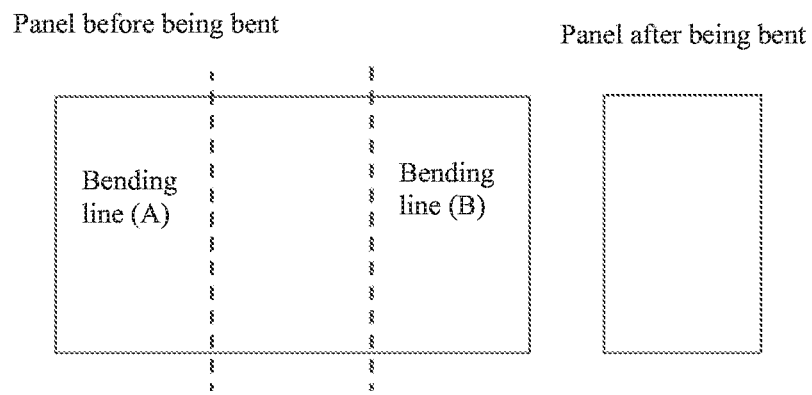
FIG. 1 is a schematic view of a folded conventional display panel.
Figure 2:
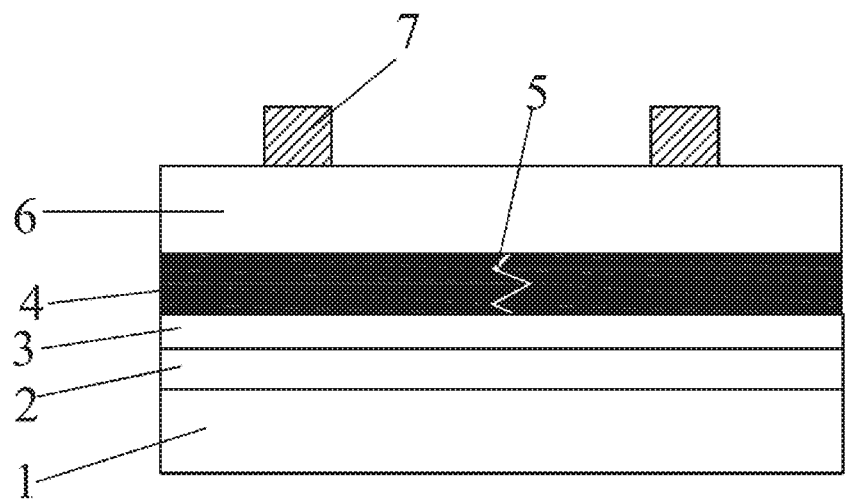
FIG. 2 is a cross-section view of one conventional display panel.
Figure 3:
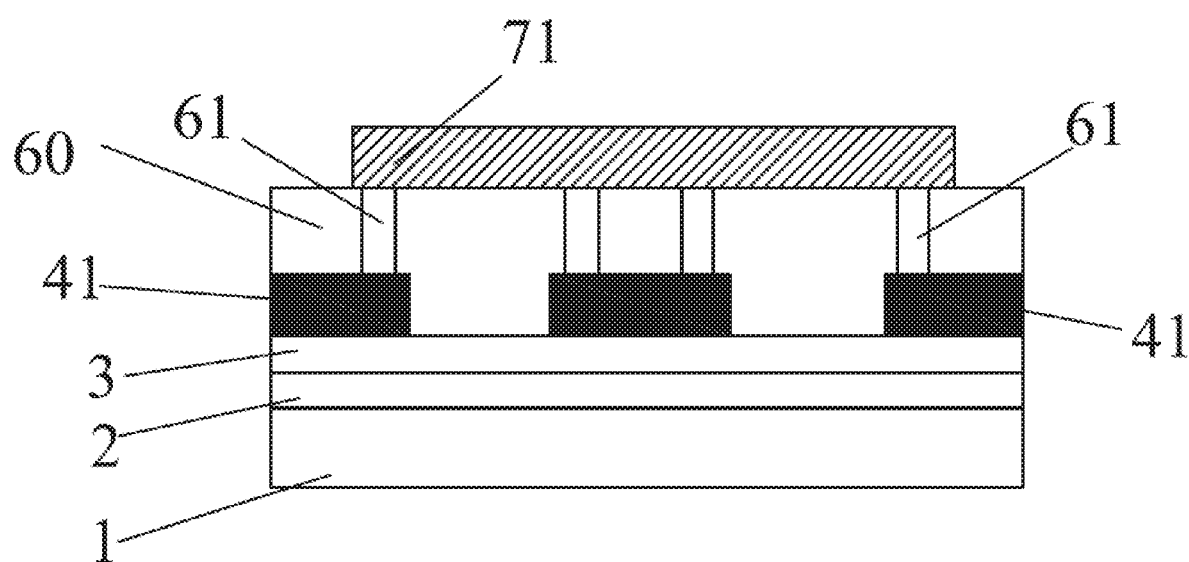
FIG. 3 is a cross-section view of one display panel in accordance with a first embodiment of the present disclosure.
Figure 4:
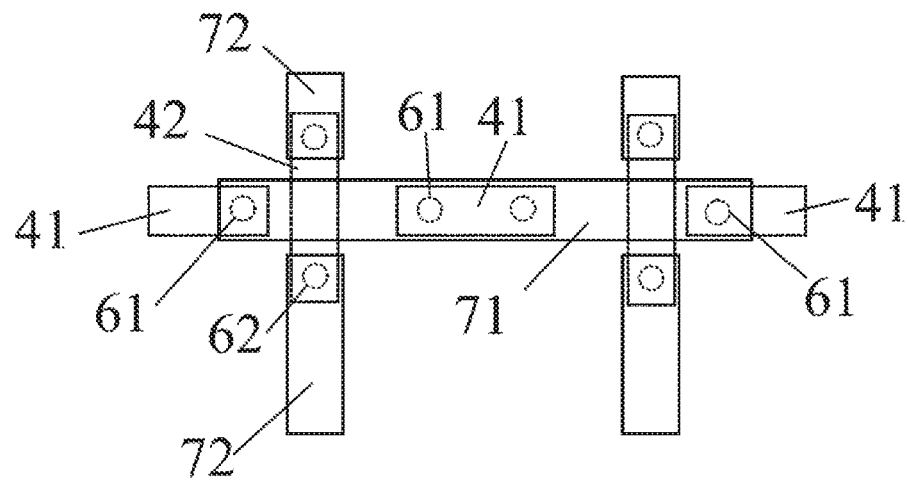
FIG. 4 is a top view of the display panel in accordance with the first embodiment of the present disclosure.

FIG. 3 is a cross-section view of one display panel in accordance with a first embodiment of the present disclosure. FIG. 4 is a top view of the display panel in accordance with the first embodiment of the present disclosure, wherein the scan line is represented by dash lines.

The display panel of the present disclosure may be a flexible, bendable or foldable display panel, and mainly includes: at least one scan line formed by a scan-line metal layer and the horizontal scan line extends through the entire effective display area, and at least one data line formed by the data-line metal layer and the vertical data line extends through the entire effective display area. At least one dielectric layer 60 is configured between the scan-line metal layer and the data line metal layer, and the dielectric layer 60 may specifically be an interlayer insulating layer. The scan line is of a segmented structure, including a plurality of sub-scan lines 41. Each of the sub-scan lines 41 is electrically connected to corresponding metal-layer connection patterns 71 through a corresponding via hole 61 of the dielectric layer 60, and the sub-scan lines 41 are electrically connected by the metal-layer connection pattern 71 of the data line to form a complete scan line together. The metal-layer connection pattern 71 of the data line may be a trace shape extending along the direction of the scan line direction.

The data lines are segmented at a location interleaved with the metal-layer connection pattern 71 of the data line, and the sub-data lines 72 constituting a complete data line respectively pass through the corresponding via holes 62 of the dielectric layer 60 to electrically connect to the metal-layer connection patterns 42 of the data line. The sub-data lines 72 are electrically connected together by the metal-layer connection pattern 42 of the scan line to form a complete data line. The metal-layer connection pattern 42 of the scan line may be of a trace shape extending along the direction of the data line direction.

When the display panel of the present disclosure is fabricated, the metal of the data-line metal layer may be filled in the via holes 61 and 62, and the data-line metal-layer connection pattern 71 or the sub-data line 72 is connected to the lower scan line through the via 61 or 62. The sub-scan lines 41 of the metal layer or the metal layer connection pattern 42 of the scan line are electrically connected. The intersection of the sub-scan lines may be located only in the bend region of the display panel or throughout the entire active display area. The display panel further includes a substrate 1, a buffer layer 2, a gate insulating layer 3, and the like, which are sequentially stacked from bottom to top, and details are not described herein again.

In a first embodiment, the scan line of the folding area of the display panel adopts a plurality of sections of molybdenum metal to replace the entire molybdenum metal through the effective display area, and the via of the inter-layer insulating layer and the data lines made by metal having better extensibility are used in the middle. The data line can be of a Ti/Al/Ti three-layer structure, Mo/Al/Mo three-layer structure or Mo/Cu double-layer structure, which can reduce the probability of occurrence of molybdenum metal fracture when the panel is bent.

Figure 5:
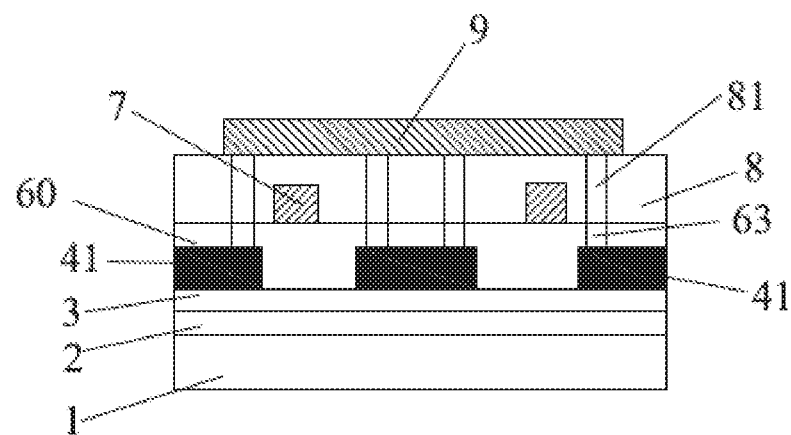
FIG. 5 is a cross-section view of one display panel in accordance with a second embodiment of the present disclosure.

FIG. 5 is a cross-section view of one display panel in accordance with a second embodiment of the present disclosure. The display panel of the present disclosure may be a flexible, bendable or foldable display panel, and mainly includes: at least one scan line formed by a scan-line metal layer and the horizontal scan line extends through the entire effective display area, and at least one data line 7 formed by the data-line metal layer and the vertical data line extends through the entire effective display area, a conductive material layer for forming a conductive structure in the display panel, and at least one dielectric layer interposed between the scan-line metal layer and the conductive material layer. In the embodiment, the conductive material layer may be an OLED anode material layer for forming an OLED anode. The dielectric layer may include an organic planarization layer (PLN) 8 and an interlayer insulating layer 60.

The scan lines includes a plurality of sub-scan lines. The sub-scan lines 41 constituting one complete scan line passes through the corresponding via holes 63 and 81 of the interlayer insulating layer 60 and the organic flat layer 8 to electrically connect to the corresponding connection pattern 9 of the conductive material layer, respectively. The connection pattern of the conductive material layer electrically connects to each of the sub-scan lines 41 to form a complete scan line. The connection pattern 9 of the conductive material layer may be a trace shape extending along the direction of the scan line.

When the display panel of the present disclosure is fabricated, the material of the conductive material layer, that is, the OLED anode material, may be filled in the upper and lower via holes 63 and 81 that are communicated. The connection pattern 9 of the conductive material layer is connected to the lower sub-scan line of the metal layer through the via holes 63 and 81. The sub-scan lines 41 are electrically connected. The area of the sub-scan lines may be located only in the bend region of the display panel or throughout the entire active display area. The display panel further includes a substrate 1 a buffer layer 2 a gate insulating layer 3, and the like, which are sequentially stacked from bottom to top, and details are not described herein again. The scan-line metal layer may be molybdenum metal. The OLED anode material layer may be of an ITO/Ag/ITO three-layer structure. The data-line metal layer may be of a Ti/Al/Ti three-layer structure, Mo/Al/Mo three-layer structure, or Mo/Cu double layer structure.

In the second embodiment, the scan line of the folding area of the display panel adopts a plurality of sections of molybdenum metal to replace the entire molybdenum metal through the effective display area. The OLED anode material and the scan-line metal layer is connected by the via hole 81 of the PLN 8 between the data line 7 and the OLED anode material layer. The top emission OLED anode material can be the silver acting as a reflective electrode, and the connecting material for connecting the scan line can reduce the scan line break of the molybdenum metal when the display panel is bent. The occurrence of wire breakage can also reduce the thickness of the underlying interlayer insulating layer 60 to avoid cracking of the interlayer insulating layer 60 during bending.

In view of the above, the scan lines of the display panel adopts a segmented structure, and then connects the sub-scan lines together, thereby reducing the probability of occurrence of scan line break when the display panel is bent.

Above are embodiments of the present invention, which does not limit the scope of the present invention. Any equivalent amendments within the spirit and principles of the embodiment described above should be covered by the protected scope of the invention.

What is claimed is:
1. A display panel, comprising:
  at least one scan line formed by a first metal layer, at least one data line formed by a second metal layer, and at least one dielectric layer between the first metal layer and the second metal layer;
  the scan line being of a segment structure comprising a plurality of sub-scan lines electrically connecting to connection patterns of the corresponding second metal layer via corresponding via holes of the dielectric layer, and the connection patterns of the second metal layer electrically connecting the sub-scan lines together; and intersections between the data line and the connection patterns of the second metal layer being configured to be the segment structure, the data line being of the segment structure comprising a plurality of sub-data lines electrically connecting to the connection patterns of the corresponding first metal layer via the corresponding via holes of the dielectric layer, and the connection patterns of the first metal layer electrically connecting the sub-data lines together;

wherein the data line extends in a direction to intersect with the scan line at an intersection site, such that one of the connection patterns of the first metal layer that forms a part of the data line at the intersection site is located between a gap between two adjacent ones of the sub-scan lines and intersects with one of the connection patterns of the second metal layer to form one of the intersections between the data line and the connection patterns of the second metal layer, the part of the data line at the intersection site being one of the connection patterns of the first metal layer located at an underside of the connection pattern of the second metal layer that is adjacent to the first metal layer.

2. The display panel as claimed in claim 1, wherein the dielectric layer is an inter-layer insulating layer.

3. The display panel as claimed in claim 1, wherein the second metal layer is of a Ti/Al/Ti three-layer structure, a Mo/Al/Mo three-layer structure or a Mo/Cu double-layer structure.

4. The display panel as claimed in claim 1, wherein the first metal layer comprises molybdenum metal.

5. The display panel as claimed in claim 1, wherein the scan line is located in a bend region of the display panel or throughout an entire active display area.

6. A display panel, comprising:

at least one scan line formed by a first metal layer, at least one data line formed by a second metal layer, a conductive material layer for forming a conductive structure in the display panel, and at least one dielectric layer between the first metal layer and the conductive structure; and the scan line is of a segment structure comprising a plurality of sub-scan lines electrically connecting to connection patterns of the corresponding conductive material layer via corresponding via holes of the dielectric layer, and the connection patterns of the conductive material layer electrically connecting the sub-scan lines together;

wherein the data line extends in a direction to intersect with the scan line at an intersection site, such that a part of the data line at the intersection site is located between a gap between two adjacent ones of the sub-scan lines and intersects with one of the connection patterns of the conductive material layer, the part of the data line at the intersection site being at an underside of the connection pattern of the conductive material layer that is adjacent to the first metal layer.

7. The display panel as claimed in claim 6, wherein the conductive material layer comprises an organic light-emitting diode (OLED) anode material layer for forming an OLED anode.

8. The display panel as claimed in claim 7, wherein the first metal layer comprises molybdenum metal, and the OLED anode material layer is of an ITO/Ag/ITO three-layer structure.

9. The display panel as claimed in claim 6, wherein the dielectric layer comprises an organic planarization layer and an interlayer insulating layer.

10. The display panel as claimed in claim 6, wherein the scan line is located in a bend region of the display panel or throughout an entire active display area.

* * * * *